US012627304B1

(12) United States Patent
Li et al.

(10) Patent No.: US 12,627,304 B1
(45) Date of Patent: May 12, 2026

(54) STABILIZED MICROWAVE-FREQUENCY SOURCE INCORPORATING A TUNABLE VOLTAGE-CONTROLLED OSCILLATOR

(71) Applicant: HQPHOTONICS INC., Pasadena, CA (US)

(72) Inventors: Jiang Li, Alhambra, CA (US); Kerry Vahala, Pasadena, CA (US)

(73) Assignee: HQPHOTONICS INC., Pasadena, CA (US)

( * ) Notice: Subject to any disclaimer, the term of this patent is extended or adjusted under 35 U.S.C. 154(b) by 276 days.

(21) Appl. No.: 18/608,907

(22) Filed: Mar. 18, 2024

Related U.S. Application Data

(60) Provisional application No. 63/453,088, filed on Mar. 18, 2023.

(51) Int. Cl.
　　H03L 7/093 (2006.01)
　　H01S 3/13 (2006.01)
　　(Continued)

(52) U.S. Cl.
　　CPC ............ H03L 7/093 (2013.01); H01S 3/1305 (2013.01); H01S 3/30 (2013.01); H03L 7/099 (2013.01); H03L 7/18 (2013.01)

(58) Field of Classification Search
　　CPC .............. H03L 7/099; H03L 7/18; H03L 7/16
　　See application file for complete search history.

(56) References Cited

U.S. PATENT DOCUMENTS 5,687,261　A　*　11/1997　Logan .................... H04B 10/50
　　　　　　　　　　　　　　　　　385/11
8,378,751　B2 *　2/2013　Fagg ........................ H03L 7/23
　　　　　　　　　　　　　　　　　331/10

(Continued)

OTHER PUBLICATIONS

Fortier et al; Generation of ultrastable microwaves via optical frequency division; Nature Photonics, vol. 5, No. 7, pp. 425-429, 2011.

(Continued)

*Primary Examiner* — Diana J. Cheng
(74) *Attorney, Agent, or Firm* — David S. Alavi

(57)　　　　　　ABSTRACT

A tunable voltage-controlled oscillator (VCO), a dual optical-frequency reference source, an electrical reference oscillator, and an electro-optic frequency divider (eOFD) form a microwave-frequency source. The VCO generates output and modulating signals at frequency $f_M$ that is tunable over at least ±5% or more of a nominal microwave frequency. From the VCO signal at $f_M$ and output from the dual optical-frequency reference source at frequencies $v_1$ and $v_2$, the eOFD generates an eOFD signal at $\delta f = |v_2 - v_1 - n \cdot f_M|$ from which a loop-filtered error signal is derived, dependent on relative phase of the eOFD signal and a reference oscillator signal. The error signal is applied to the VCO to function as a phase-locked loop to stabilize the frequency $f_M$, which can exhibit phase noise across the tuning range that is $-120$ dBc/Hz+$10*\log_{10}(f_M/10$ GHZ), or less, at 10 kHz offset frequency.

22 Claims, 5 Drawing Sheets

(51) Int. Cl.
  *H01S 3/30* (2006.01)
  *H03L 7/099* (2006.01)
  *H03L 7/18* (2006.01)

(56) References Cited

U.S. PATENT DOCUMENTS

| | | | | |
|---|---|---|---|---|
| 9,450,673 | B2 | 9/2016 | Vahala et al. | |
| 9,537,571 | B2 * | 1/2017 | Li | H04L 7/0091 |
| 9,905,999 | B2 * | 2/2018 | Li | H01S 5/0687 |
| 10,009,103 | B2 * | 6/2018 | Vahala | H03L 7/16 |
| 10,523,214 | B1 * | 12/2019 | Li | H01S 3/094096 |
| 2017/0302048 | A1 * | 10/2017 | Li | H01S 3/1305 |

OTHER PUBLICATIONS

Xie et al; Photonic microwave signals with zeptosecond-level absolute timing noise; Nature Photonics, vol. 11, No. 1, pp. 44-47, 2017.
Li et al; Electro-optical frequency division and stable microwave synthesis; Science, vol. 345, No. 6194, pp. 309-313, 2014.
Li et al; A 30 Ghz ultra-low-phase-noise oscillator using electro-optical frequency division; 2017 IEEE Photonics Conference (IPC), IEEE, 2017, pp. 455-456.
Li et al; Small-sized, ultra-low phase noise photonic microwave oscillators at X-Ka bands; Optica, vol. 10, No. 1, pp. 33-34, 2023.
Fujiwara et al; Flattened optical multicarrier generation of 12.5 GHz spaced 256 channels based on sinusoidal amplitude and phase hybrid modulation; Electron. Lett. 37, 967-968 (2001).
Huang et al; Nonlinearly broadened phase-modulated continuous-wave laser frequency combs characterized using DPSK decoding; Opt. Express 16, 2520-2527 (2008).

* cited by examiner

STABILIZED MICROWAVE-FREQUENCY SOURCE INCORPORATING A TUNABLE VOLTAGE-CONTROLLED OSCILLATOR

BENEFIT CLAIM

This application claims benefit of U.S. provisional App. No. 63/453,088 entitled "Stabilized microwave-frequency source incorporating a tunable voltage-controlled oscillator" filed 18 Mar. 2023 in the names of Li et al, said provisional application being incorporated herein by reference in its entirety.

STATEMENT REGARDING FEDERALLY SPONSORED RESEARCH OR DEVELOPMENT

This invention was made with government support under (i) Contract No. W912CG20C0034 awarded by the United States Army, and (ii) Contract No. HR001122C0019 awarded by the Defense Advanced Research Projects Agency (DARPA). The government has certain rights in the invention.

FIELD OF THE INVENTION

The field of the present invention relates to microwave-frequency sources.

BACKGROUND

Some relevant background information relevant to stabilized microwave frequency sources can be found in:

[1] T. M. Fortier, M. S. Kirchner, F. Quinlan, J. Taylor, J. Bergquist, T. Rosen-band, N. Lemke, A. Ludlow, Y. Jiang, C. Oates et al., "Generation of ultrastable microwaves via optical frequency division," Nature Photonics, vol. 5, no. 7, pp. 425-429, 2011;

[2] X. Xie, R. Bouchand, D. Nicolodi, M. Giunta, W. Hänsel, M. Lezius, A. Joshi, S. Datta, C. Alexandre, M. Lours et al., "Photonic microwave signals with zeptosecond-level absolute timing noise," nature photonics, vol. 11, no. 1, pp. 44-47, 2017;

[3] J. Li, X. Yi, H. Lee, S. A. Diddams, and K. J. Vahala, "Electro-optical frequency division and stable microwave synthesis," Science, vol. 345, no. 6194, pp. 309-313, 2014;

[4] J. Li and K. Vahala, "A 30 Ghz ultra-low-phase-noise oscillator using electro-optical frequency division," in 2017 IEEE Photonics Conference (IPC). IEEE, 2017, pp. 455-456;

[5] J. Li and K. Vahala, "Small-sized, ultra-low phase noise photonic microwave oscillators at X-Ka bands," Optica, vol. 10, no. 1, pp. 33-34, 2023;

[6] M. Fujiwara, et al, "Flattened optical multicarrier generation of 12.5 GHZ spaced 256 channels based on sinusoidal amplitude and phase hybrid modulation." Electron. Lett. 37, 967-968 (2001);

[7] C. B. Huang, et al, Nonlinearly broadened phase-modulated continuous-wave laser frequency combs characterized using DPSK decoding. Opt. Express 16, 2520-2527 (2008);

[8] U.S. Pat. No. 9,450,673 entitled "Stabilized microwave frequency source" issued Sep. 20, 2016 to Vahala et al; and

[9] U.S. Pat. No. 9,905,999 entitled "Optical frequency divider based on an electro-optical-modulator frequency comb" issued Feb. 27, 2018 to Li et al.

Each of the preceding references in incorporated by reference herein in its entirety.

Low phase noise microwave oscillators and synthesizers are fundamental building blocks in communications, laboratory instrumentation, and defense applications. In the last decade, optical frequency division (OFD) has revolutionized low phase noise microwave generation and has generated ultra-low phase noise microwaves near X band (10 GHz carrier frequency) [1,2]. Conventional OFD systems transfer the fractional frequency stability from an optical reference to the microwave domain via a self-referenced, mode-locked frequency comb [1,2]. These systems require octave-spanning mode-locked lasers and a bulk cavity-stabilized reference laser. Also, highly linear photodetectors are needed to suppress amplitude to phase noise conversion caused by detection of high-peak power pulse trains [1,2].

Electro-optical frequency division (eOFD) provides a simpler way to achieve OFD using dual laser references and an electro-optical (EO) frequency comb (built from telecomm phase/amplitude modulators) [3,4]. eOFD oscillators from X to Ka band have been demonstrated with small form factors and ultra-low-phase-noise (ULPN) performances [4,5]. A ULPN eOFD oscillator at 30 GHz with phase noise of −151 dBc/Hz at 10 KHz offset has been reported [4]. At 40 GHZ, a record-low phase noise of −153 dBc/Hz has been achieved (10 kHz offset, 40 GHz carrier) in a compact modular form factor (10"×9"×2") [5]. Other examples of ULPN microwave sources have been demonstrated [8,9].

SUMMARY

An inventive microwave-frequency source comprises a tunable voltage-controlled electrical oscillator (VCO), a dual optical-frequency reference source, an electrical reference oscillator, and an electro-optic frequency divider (eOFD). The VCO generates a VCO output electrical signal at a frequency $f_M$, a first portion of which forms an output electrical signal of the microwave-frequency source. The VCO is tunable over a tuning range for the frequency $f_M$ that spans at least ±5% of a nominal microwave frequency, the nominal microwave frequency being between 1 GHz and 100 GHz. In some examples the tuning range for the frequency $f_M$ spans at least ±10%, ±25%, or ±33% of the nominal microwave frequency; in some examples the tuning range for the frequency $f_M$ spans at least from 8 GHz to 40 GHz.

The dual optical-frequency reference source generates a first optical reference signal at a first optical reference frequency $v_1$ and a second optical reference signal at a second optical reference frequency $v_2$ that is greater than $v_1$. The electrical reference oscillator generates a reference oscillator electrical signal at a reference oscillator frequency $\delta f_{REF}$. The eOFD receives the first and second optical reference signals, a second portion of the VCO output electrical signal, and the reference oscillator electrical signal. From the first and second optical reference signals and the second portion of the VCO output electrical signal the eOFD generates an eOFD electrical signal at a frequency $\delta f = |v_2 - v_1 - n \cdot f_M|$ where n is an integer, and then generates a loop-filtered electrical error signal dependent on relative phase of the reference oscillator and eOFD electrical signals. The loop-filtered electrical error signal is applied to the VCO to couple the VCO and the eOFD in a negative feedback arrangement so as to function as a phase-locked loop to stabilize the frequency $f_M$. The output electrical signal of the microwave-frequency source can exhibit, over the entire tuning range for the frequency $f_M$, phase noise of $-120$ dBc/Hz$+10*\log_{10}(f_M/10$ GHZ$)$, or less, at 10 KHz offset frequency.

Objects and advantages pertaining to microwave-frequency sources may become apparent upon referring to the example embodiments illustrated in the drawings and disclosed in the following written description or appended claims.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

The embodiments depicted are shown only schematically; all features may not be shown in full detail or in proper proportion; for clarity certain features or structures may be exaggerated or diminished relative to others or omitted entirely; the drawings should not be regarded as being to scale unless explicitly indicated as being to scale. The embodiments shown are only examples and should not be construed as limiting the scope of the present disclosure or appended claims.

DETAILED DESCRIPTION

The following detailed description should be read with reference to the drawings, in which identical reference numbers refer to like elements throughout the different figures. The drawings, which are not necessarily to scale, depict selective examples and are not intended to limit the scope of the inventive subject matter. The detailed description illustrates by way of example, not by way of limitation, the principles of the inventive subject matter.

Previous stabilized microwave-frequency sources (e.g., ULPN microwave sources), including those listed above, operate at only a single nominal output frequency, e.g., 30 GHZ, 40 GHZ, or other single nominal microwave frequency, e.g., between 1 GHz and 100 GHz. It would be desirable to provide a tunable microwave-frequency source than can provide ultra-low-phase-noise performance over a wider tuning range, e.g., over at least an octave.

According, examples are disclosed herein of an inventive stabilized microwave-frequency source 10 that produces an output electrical signal at a frequency $f_M$ that is tunable over at least ±5%, ±10%, ±25%, or ±33% of the nominal microwave frequency. In some examples the frequency $f_M$ of the output signal is tunable from 8 GHz to 40 GHz.

Figure 1:
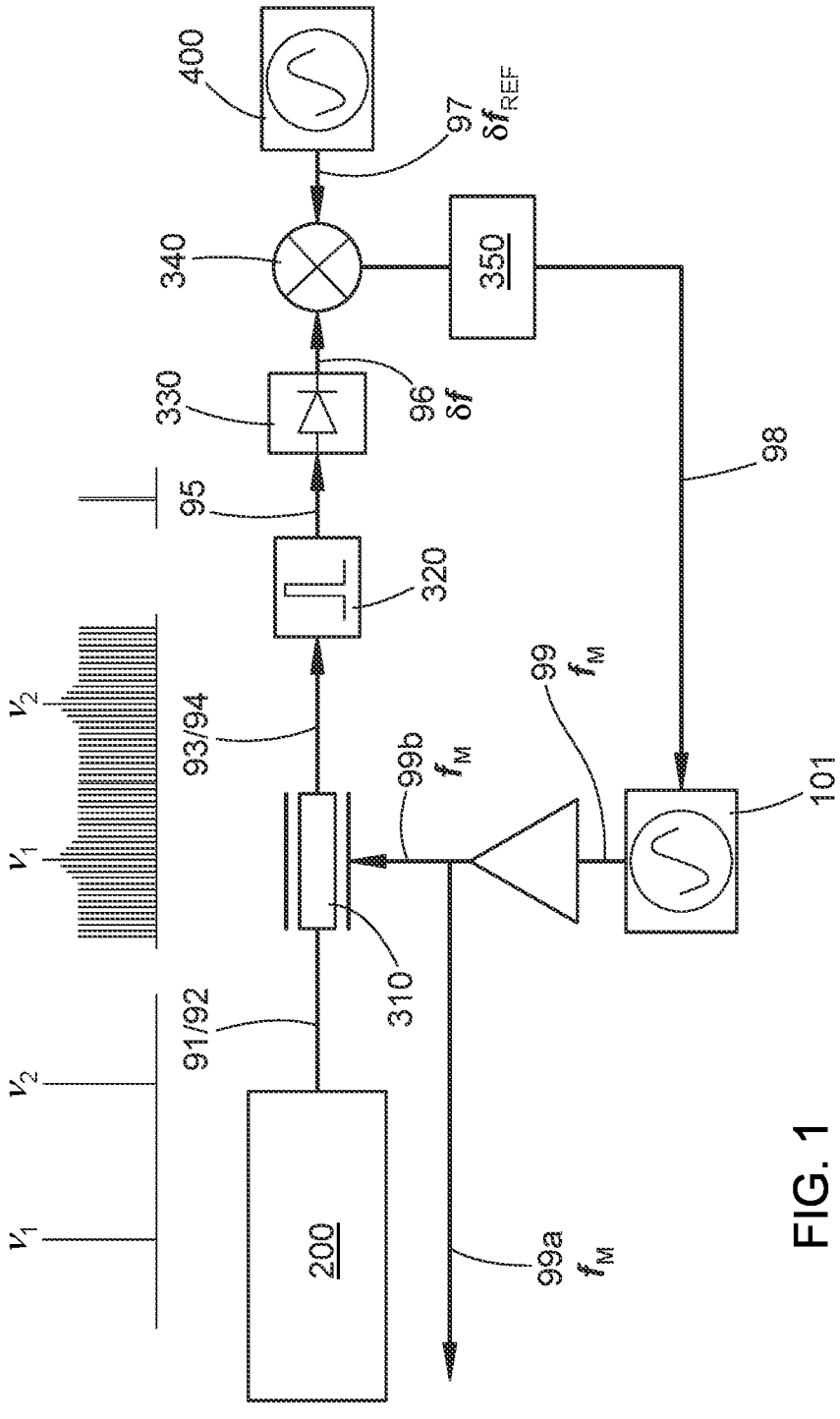
FIG. 1 illustrates schematically a first example of a stabilized tunable microwave-frequency source.
Figure 5:
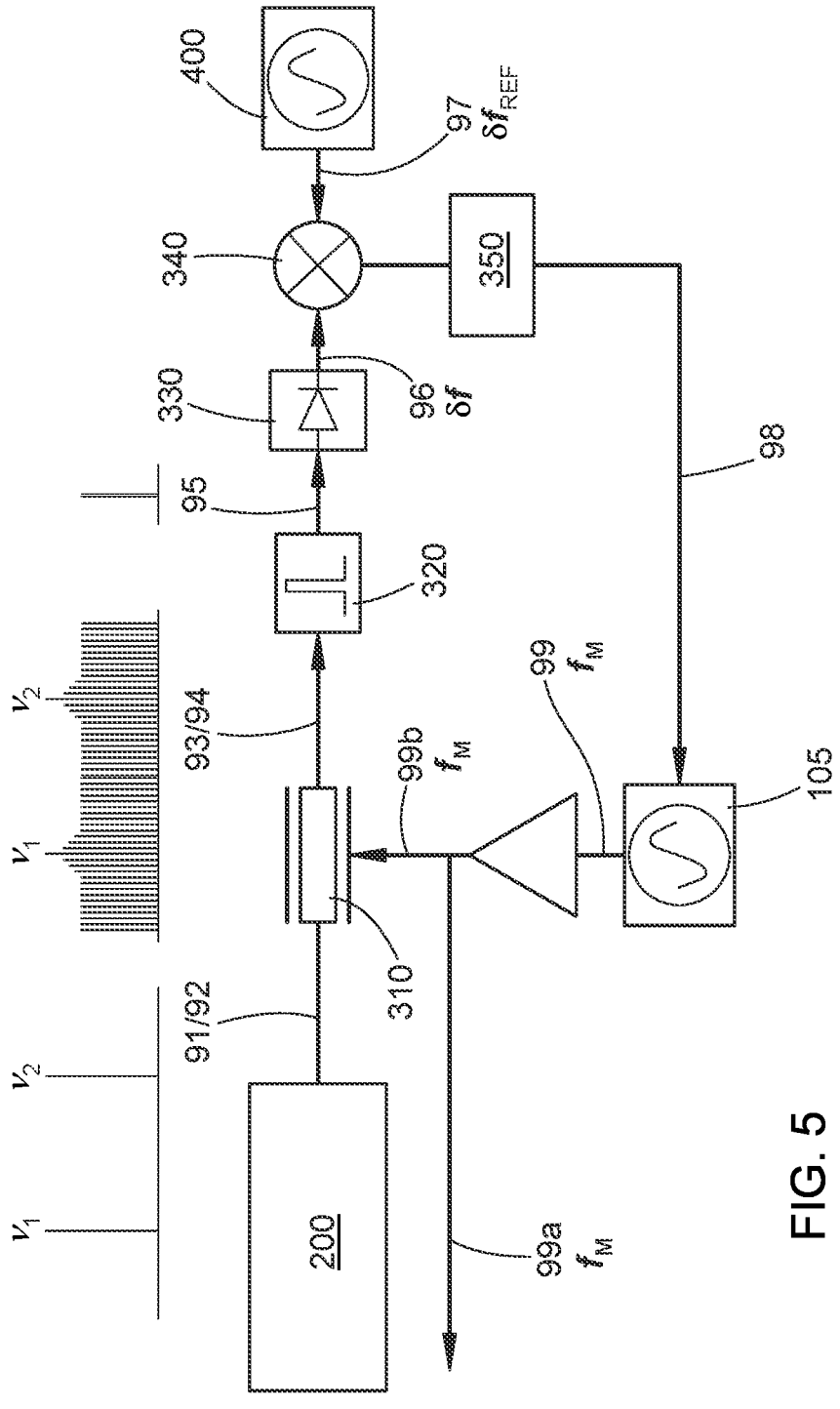
FIG. 5 illustrates schematically a second example of a stabilized tunable microwave-frequency source.

Two examples of an inventive microwave-frequency source 10 are illustrated schematically in FIGS. 1 and 5. Each of those examples includes a tunable VCO 101 or 105, a dual optical-frequency reference source 200, an electrical reference oscillator 400, and an electro-optic frequency divider (eOFD) 300. In the example of FIG. 1, the VCO 101 includes a tunable yttrium-iron-garnet (YIG) VCO; in the example of FIG. 5, the VCO 105 includes a tunable integrated circuit VCO. The tunable VCO 101/105 generates a VCO output electrical signal 99 at a frequency $f_M$, in some examples the signal 99 is amplified (e.g., at amplifier 110). A first portion 99a of the electrical signal 99 forms the output of the microwave-frequency source 10, while a second portion 99b of the electrical signal 99 is received by the eOFD 300. The VCO 101/105 is tunable over a tuning range for the frequency $f_M$ that spans at least at least ±5%, ±10%, ±25%, or ±33% of the nominal microwave frequency (equivalently, from 0.95 to 1.05 times the nominal frequency, from 0.9 to 1.1 times the nominal frequency, from 0.75 to 1.25 times the nominal frequency, or from 0.67 to 1.33 times the nominal frequency, respectively). Note that tuning over at least ±33% of the nominal microwave frequency corresponds to tuning over at least one octave, i.e., a highest frequency of the tuning range is a least two times a lowest frequency of the tuning range. The nominal microwave frequency can be between 1 GHz and 100 GHz, or between 5 GHz and 50 GHz.

In some examples the tuning range for the frequency $f_M$ can span at least from 8 GHz to 40 GHz. In some examples (e.g., as in FIG. 1) the VCO 101 can include a yttrium iron garnet (YIG) VCO; in such examples the free-running frequency of the YIG VCO can be tuned by applying an external magnetic field. In some examples the VCO 105 can include an integrated-circuit VCO, e.g., an ADF5709 monolithic microwave integrated circuit manufactured by Analog Devices, Inc. In some examples the VCO 101/105 can include a fundamental VCO (YIG in VCO 101, integrated circuit in VCO 105, or other suitable VCO type) and a frequency multiplier coupled to the fundamental VCO that produces signals at, e.g., two, three, four, or more times the frequency of the fundamental VCO output. The VCO 101/105 can be arranged so that the fundamental VCO provides the VCO output electrical signal 99 over a lower-frequency portion of the tuning range for the frequency $f_M$ (e.g., from 8 GHz to 20 GHZ) and the frequency multiplier provides the VCO output electrical signal 99 over a higher-frequency portion of the tuning range for the frequency $f_M$ (e.g., from 20 GHz to 40 GHZ). In some examples the frequency multiplier can include a frequency doubler.

Figure 3:
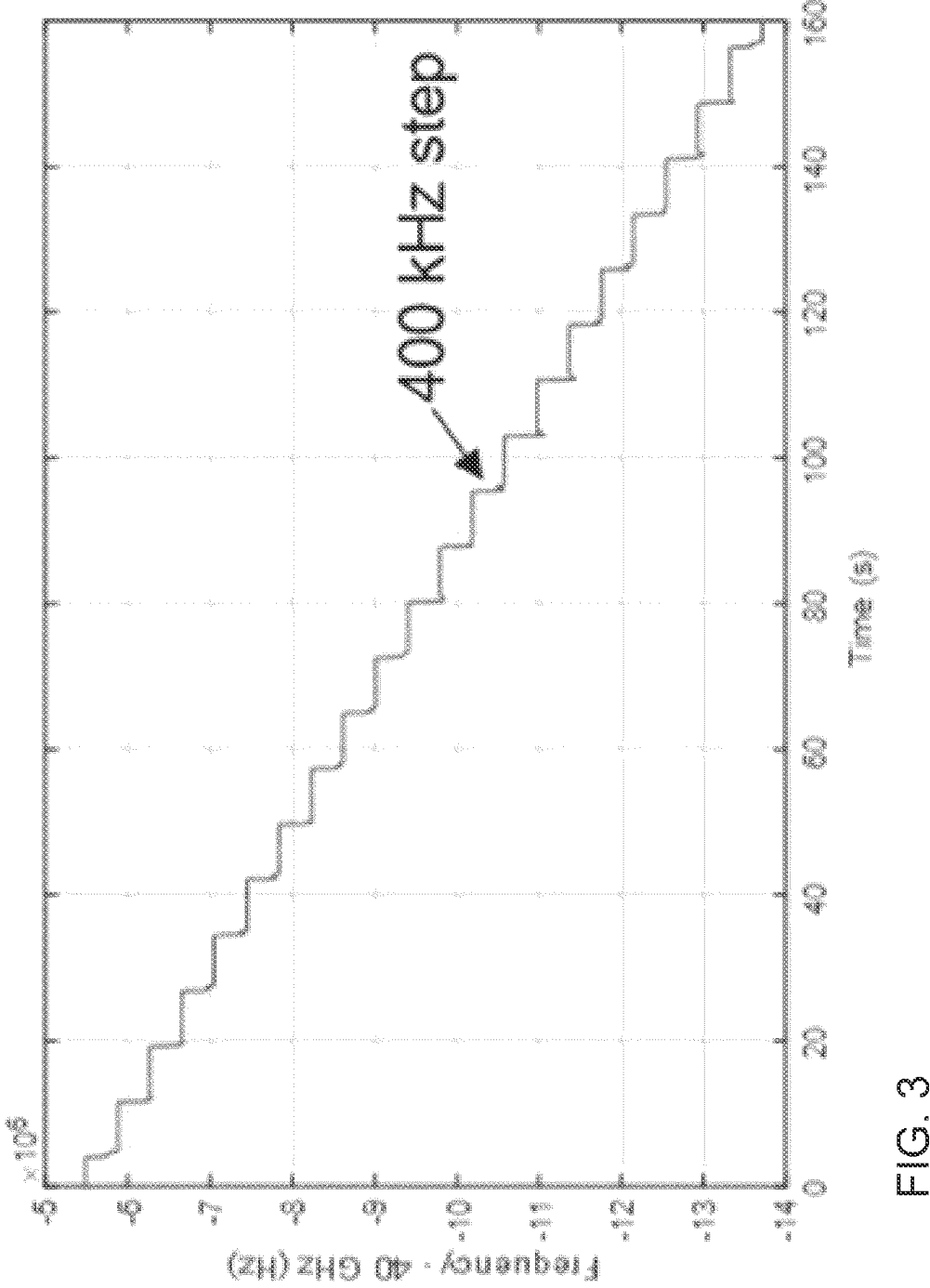
FIG. 3 is a plot illustrating tuning of the microwave-frequency source of FIG. 1 in 400 kHz steps near an output frequency of 40 GHz.
Figure 4:
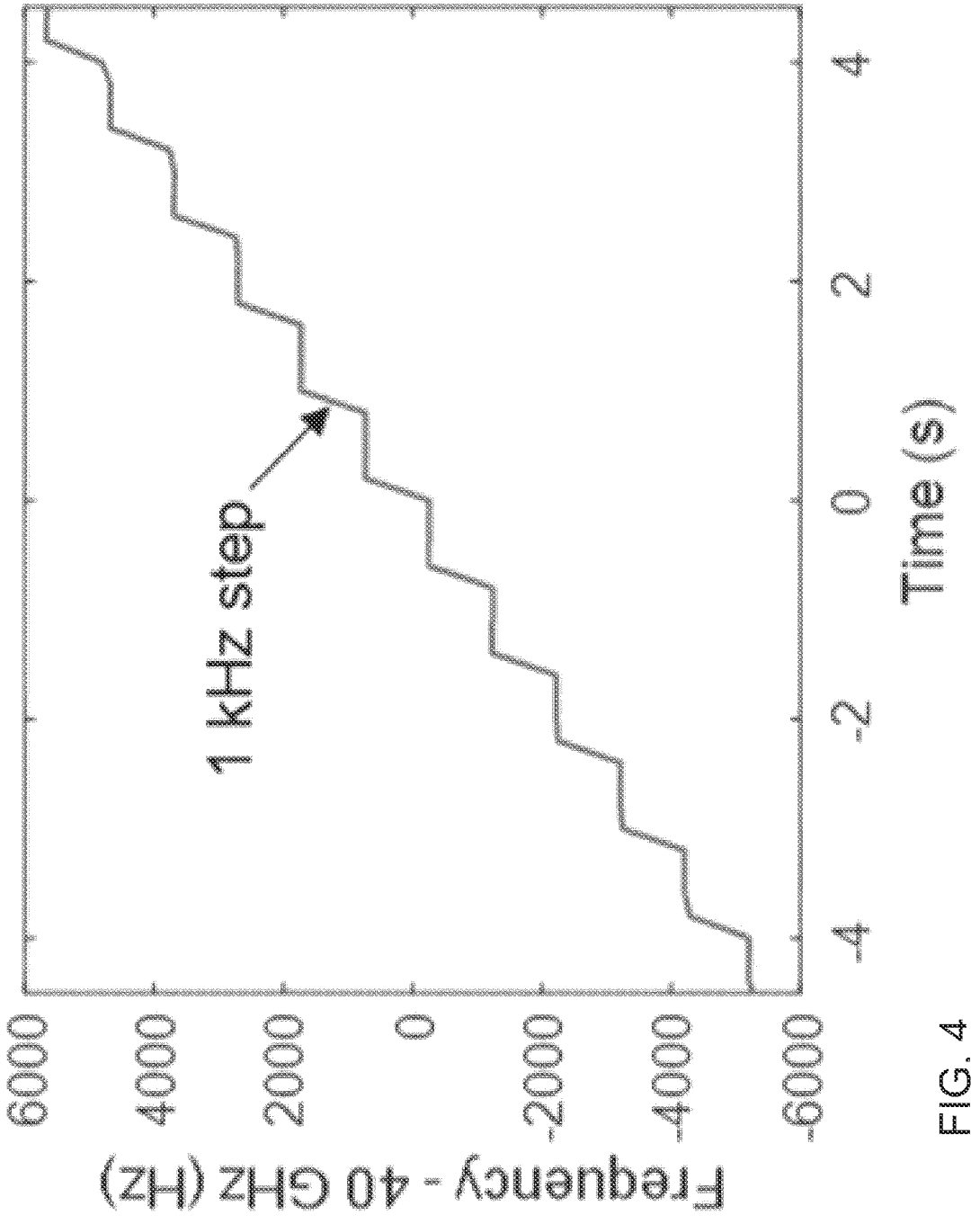
FIG. 4 is a plot illustrating tuning of the microwave-frequency source of FIG. 1 in 1 kHz steps near an output frequency of 40 GHz.

FIG. 3 is a plot illustrating tuning of the YIG VCO 101 in 400 kHz steps of the frequency $f_M$ of the output signal 99 near a nominal microwave frequency of 40 GHz. FIG. 4 is a plot illustrating tuning of the YIG VCO 101 in 1 kHz steps of the frequency $f_M$ of the output signal 99 near a nominal microwave frequency of 40 GHz.

The dual optical-frequency reference source 200 generates first and second optical reference signals 91 and 92 at respective first and second optical reference frequencies $v_1$ and $v_2$, with $v_2$ greater than $v_1$. The dual optical-frequency reference source 200 can be of any suitable type or arrangement, including, e.g., those disclosed in U.S. Pat. Nos. 9,537,571, 10,014,649, or U.S. non-provisional application Ser. No. 18/098,628 filed 18 Jan. 2023 in the names of Li et al, each of which is incorporated herein by reference in its entirety. In some examples the dual optical-frequency reference source can include first and second frequency-stabilized reference laser sources operating at respective laser frequencies $v_{L1}$ and $v_{L2}$. In some of those examples the dual optical-frequency reference source 200 can include an optical reference cavity, with the first and second reference laser sources each being frequency-locked to a corresponding distinct resonant optical mode of the optical reference cavity. In some examples the optical reference cavity can be arranged as a ring resonator, e.g., a whispering-gallery-mode resonator, a ring waveguide resonator on a substrate, a disk resonator, a spiral waveguide resonator on a substrate, or a fiber-ring resonator. The reference laser sources can be frequency-locked to the optical reference cavity in any suitable way, e.g., by a Pound-Drever-Hall locking mechanism, a Hänsch-Couillaud locking mechanism, or self-injection locking.

In some examples the first and second optical reference signals 91 and 92 include laser outputs of the first and second reference laser sources so that $v_1 = v_{L1}$ and $v_2 = v_{L2}$. In some other examples the optical reference cavity is characterized by a Brillouin frequency vs, and the first and second reference laser sources act as pump lasers to produce corresponding first and second stimulated Brillouin laser (SBL) outputs from the optical reference cavity at respective SBL frequencies $v_{1L}$-$v_B$ and $v_{2L}$-$v_B$. In such examples the first and second optical reference signals 91 and 92 can include the first and second SBL outputs so that $v_1 = v_{1L}$-$v_B$ and $v_2 = v_{2L}$-$v_B$.

The electrical reference oscillator 400 generates a reference oscillator electrical signal 97 at a reference oscillator frequency $\delta f_{REF}$. The reference oscillator 400 can be of any suitable type or arrangement; in some examples a crystal oscillator can be employed. Any suitable frequency $\delta f_{REF}$ can be employed; in some examples the reference oscillator frequency $\delta f_{REF}$ can be between 1 MHz and 40 GHz.

The electro-optic frequency divider (eOFD) 300 can be of any suitable type or arrangement, including, e.g., those disclosed in U.S. Pat. Nos. 9,450,673 and 9,905,999, each of which is incorporated herein by reference in its entirety. The eOFD 300 receives the first and second optical reference signals 91 and 92, the second portion 99b of the VCO output electrical signal 99, and the reference oscillator electrical signal 97. From the first and second optical reference signals 91 and 92 and the second portion 99b of the VCO output electrical signal 99, the eOFD 300 generates an eOFD electrical signal 96 at a frequency $\delta f = |v_2 - v_1 - n \cdot f_M|$ where n is an integer. Using the mixer 340 and servo controller 350, the eOFD 300 generates a loop-filtered electrical error signal 98 dependent on relative phase of the reference oscillator and eOFD electrical signals 96 and 95. The loop-filtered electrical error signal 98 is applied to the VCO 101 or 105 to couple the VCO 101 or 105 and the eOFD 300 in a negative feedback arrangement so as to function as a phase-locked loop to stabilize the frequency $f_M$.

In some examples (e.g., as in FIGS. 1 and 5), the eOFD 300 generates from the first or second optical reference signals 91 or 92 corresponding first or second optical frequency combs 93 or 94, or both, with respective frequency-comb components at frequencies $v_1 \pm n_1 \cdot f_M$ and $v_2 + n_2 \cdot f_M$ where $n_1$ and $n_2$ are integers. "Frequency comb" designates an optical signal made up of discrete frequency components separated by a constant frequency spacing; in the current examples that frequency spacing is the frequency $f_M$. Tuning the free-running output frequency of the VCO 101 or 105 results in concomitant tuning of the comb frequency spacing. In some examples the first or second optical frequency combs 93 or 94 can be generated by one or more optical modulators 310 (e.g., amplitude or phase modulators) driven by the second portion 99b of the VCO output electrical signal 99 at the frequency f. Additional components, such as for spectral broadening or dispersion compensation, can be employed. An optical bandpass filter 320 can be employed to transmit two closely spaced frequency comb components 95 that can then be received by a photodetector 330. The transmitted components 95 can include (i) a frequency-comb component of the first frequency comb 93 and the second optical reference signal 92, (ii) a frequency comb component of the second frequency comb 94 and the first optical reference signal 91, or (iii) frequency-comb components of both the first and second optical frequency combs 93 and 94 (as illustrated by the schematic optical spectra of the frequency combs 93 and 94 and the transmitted components 95 shown in FIGS. 1 and 5). The closely spaced transmitted spectral components 95 generate an electrical signal at the photodetector 330 that includes the eOFD signal 96 their difference frequency $\delta f = |v_2 - v_1 - n \cdot f_M|$ where nis an integer. The eOFD electrical signal 96 comprises a beat note produced by the photodetector 96 from the transmitted components 95 of the optical reference signals 91 or 92 or frequency-comb components 93 or 94.

Figure 2:
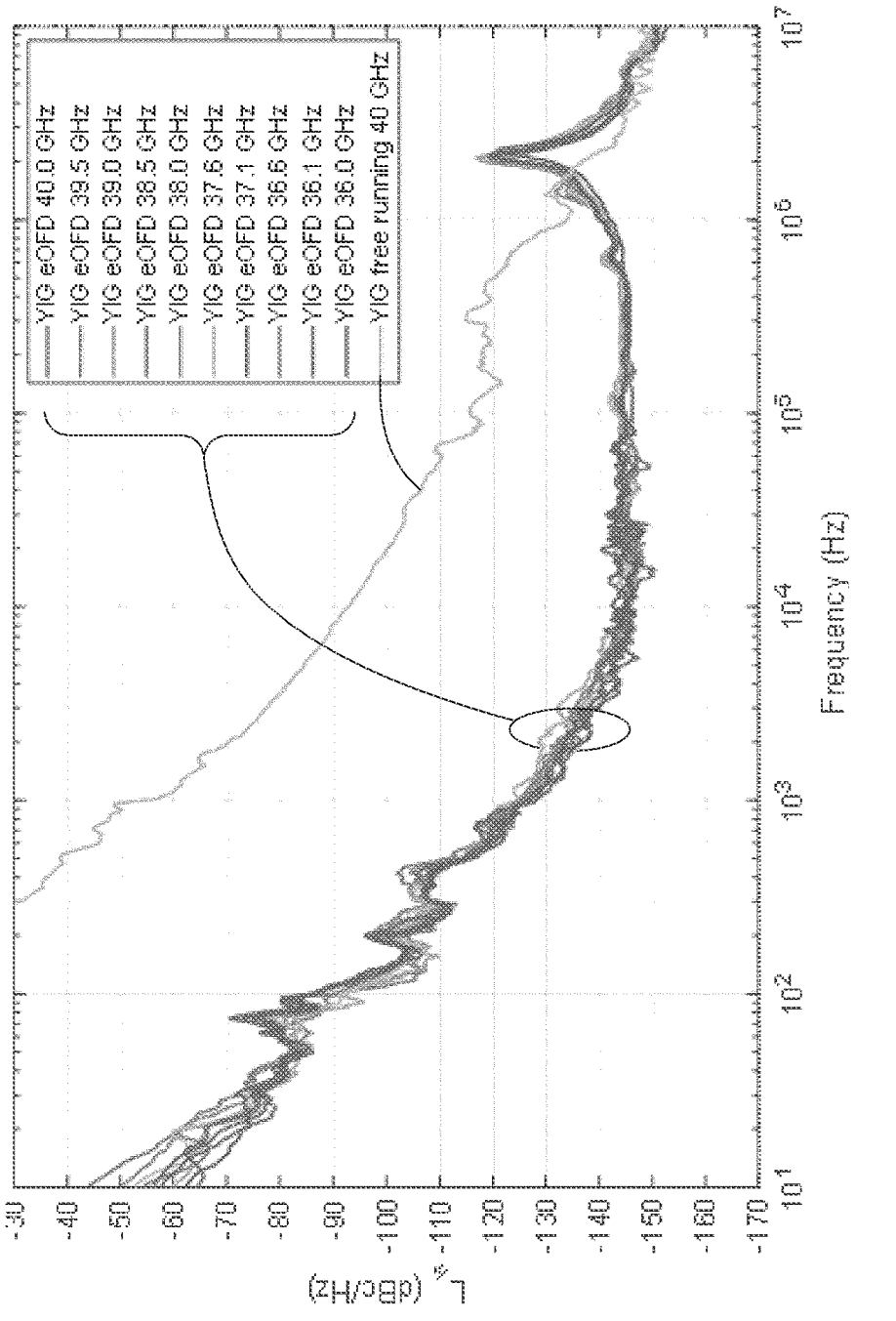
FIG. 2 are plots of phase noise of the microwave-frequency source of FIG. 1 without stabilization and at multiple different output frequencies with stabilization.

With the eOFD 300 and the VCO 101 or 105 coupled to function as a phase-locked loop (e.g., by employing closed-loop servo control of the signal 98 applied to the VCO 101 or 105), phase noise can be suppressed in the output electrical signal 99a of the microwave-frequency source 10. Noise spectra of the YIG VCO source 10 of FIG. 1 are shown in FIG. 2 for both the free-running VCO 101 (a YIG VCO running at 20 GHZ with frequency doubling to 40 GHz; upper plot) and for stabilized operation at several discrete frequencies from 36 GHz to 40 GHz. Stabilized operation results in phase noise of around –145 dBc/Hz at 10 KHz offset frequency for all output frequencies shown, representing a reduction of about five orders of magnitude relative to the free-running VCO 101. More generally, the output electrical signal 99a of the microwave-frequency source 10 can exhibit, over the entire tuning range for the frequency $f_M$, phase noise less than –120 dBc/Hz+10*$\log_{10}$ ($f_M$/10 GHZ) at 10 KHz offset frequency, less than –130 dBc/Hz+10*$\log_{10}$($f_M$/10 GHZ) at 10 KHz offset frequency, or less than –140 dBc/Hz+10*$\log_{10}$($f_M$/10 GHZ) at 10 KHz offset frequency.

In addition to the preceding, the following example embodiments fall within the scope of the present disclosure or appended claims. Any given Example below that refers to multiple preceding Examples shall be understood to refer to only those preceding Examples with which the given Example is not inconsistent, and to exclude implicitly those preceding Examples with which the given Example is inconsistent.

Example 1. A microwave-frequency source comprising: (a) a tunable voltage-controlled electrical oscillator (VCO) arranged so as to generate a VCO output electrical signal at a frequency $f_M$, a first portion of which forms an output electrical signal of the microwave-frequency source, the VCO being tunable over a tuning range for the frequency $f_M$ that spans at least ±5% of a nominal microwave frequency, the nominal microwave frequency being between 1 GHz and 100 GHZ; (b) a dual optical-frequency reference source arranged so as to generate (i) a first optical reference signal at a first optical reference frequency $v_1$ and (ii) a second optical reference signal at a second optical reference frequency $v_2$ that is greater than $v_1$; (c) an electrical reference oscillator arranged so as to generate a reference oscillator electrical signal at a reference oscillator frequency $\delta f_{REF}$; and (d) an electro-optic frequency divider (eOFD) structured and connected so as to (i) receive the first and second optical reference signals, a second portion of the VCO output electrical signal, and the reference oscillator electrical signal, (ii) generate from the first and second optical reference signals and the second portion of the VCO output electrical signal an eOFD electrical signal at a frequency $\delta f = |v_2 - v_1 - n \cdot f_M|$ where n is an integer, (iii) generating a loop-filtered electrical error signal dependent on relative phase of the reference oscillator and eOFD electrical signals, and (iv) applying the loop-filtered electrical error signal to the VCO to couple the VCO and the eOFD in a negative feedback arrangement so as to function as a phase-locked loop to stabilize the frequency $f_M$.

Example 2. The microwave-frequency source of Example 1, the tuning range for the frequency $f_M$ that spans at least ±10% of a nominal microwave frequency.

Example 3. The microwave-frequency source of Example 1, the tuning range for the frequency $f_M$ that spans at least ±25% of a nominal microwave frequency.

Example 4. The microwave-frequency source of Example 1, the tuning range for the frequency $f_M$ that spans at least ±33% of a nominal microwave frequency.

Example 5. The microwave-frequency source of Example 1, the tuning range for the frequency $f_M$ spanning at least from 8 GHz to 40 GHZ.

Example 6. The microwave-frequency source of any one of Examples 1 through 5, the VCO including a yttrium iron garnet (YIG) VCO.

Example 7. The microwave-frequency source of any one of Examples 1 through 6, the VCO including an integrated-circuit (IC) VCO.

Example 8. The microwave-frequency source of any one of Examples 1 through 7, the VCO including a fundamental VCO and a frequency multiplier coupled to the fundamental VCO, the VCO being arranged so that the fundamental VCO provides the VCO output electrical signal over a lower-frequency portion of the tuning range for the frequency $f_M$ and the frequency multiplier provides the VCO output electrical signal over a higher-frequency portion of the tuning range for the frequency f.

Example 9. The microwave-frequency source of Example 8, frequency multiplier including a frequency doubler.

Example 10. The microwave-frequency source of any one of Examples 8 or 9, the fundamental VCO being tunable over a tuning range from 8 GHz to 20 GHZ.

Example 11. The microwave-frequency source of any one of Examples 1 through 10, the dual optical-frequency reference source including first and second frequency-stabilized reference laser sources operating at respective laser frequencies $v_{L1}$ and $v_{L2}$.

Example 12. The microwave-frequency source of Example 11, the dual optical-frequency reference source including an optical reference cavity, the first and second reference laser sources each being frequency-locked to a corresponding distinct resonant optical mode of the optical reference cavity.

Example 13. The microwave-frequency source of Example 12 wherein the first and second optical reference signals include laser outputs of the first and second reference laser sources so that $v_1 = v_{L1}$ and $v_2 = v_{L2}$.

Example 14. The microwave-frequency source of Example 12 wherein (i) the optical reference cavity is characterized by a Brillouin frequency $v_B$, (ii) the first and second reference laser sources act as pump lasers to produce corresponding first and second stimulated Brillouin laser (SBL) outputs from the optical reference cavity at respective SBL frequencies $v_{1L} - v_B$ and $v_{2L} - v_B$, and (iii) the first and second optical reference signals include the first and second SBL outputs so that $v_1 = v_{1L} - v_B$ and $v_2 = v_{2L} - v_B$.

Example 15. The microwave-frequency source of any one of Examples 12 through 14, the optical reference cavity being arranged as a whispering-gallery-mode resonator, a ring waveguide resonator on a substrate, a disk resonator, a spiral waveguide resonator on a substrate, or a fiber-ring resonator.

Example 16. The microwave-frequency source of any one of Examples 12 through 15, the first and second reference laser sources being frequency locked to the optical reference cavity by a Pound-Drever-Hall locking mechanism, a Hänsch-Couillaud locking mechanism, or self-injection locking.

Example 17. The microwave-frequency source of any one of Examples 11 through 16, the eOFD being structured and arranged so as to (i) generate from the first or second optical reference signals corresponding first or second optical frequency combs, or both, with respective frequency-comb components at frequencies $v_1 + n_1 \cdot f_M$ and $v_2 + n_2 \cdot f_M$ where $n_1$ and $n_2$ are integers, and (ii) the generate the eOFD electrical signal at the frequency of by receiving at a photodetector a frequency-comb component of the first frequency comb and the second optical reference signal, a frequency comb component of the second frequency comb and the first optical reference signal, or frequency-comb components of both the first and second optical frequency combs, the eOFD electrical signal comprising a beat note produced by the photodetector from the received optical reference signals or frequency-comb components.

Example 18. The microwave-frequency source of Example 17, the first or second optical frequency combs being generated by one or more optical modulators driven by the second portion of the VCO output electrical signal at the frequency $f_M$.

Example 19. The microwave-frequency source of any one of Examples 1 through 18, the reference oscillator frequency $\delta f_{REF}$ being between 1 MHz and 40 GHz.

Example 20. The microwave-frequency source of any one of Examples 1 through 19, the output electrical signal of the microwave-frequency source exhibiting, over the entire tuning range for the frequency $f_M$, phase noise less than −120 dBc/Hz+10*$\log_{10}(f_M/10$ GHZ) at 10 KHz offset frequency.

Example 21. The microwave-frequency source of any one of Examples 1 through 19, the output electrical signal of the microwave-frequency source exhibiting, over the entire tuning range for the frequency $f_M$, phase noise less than −130 dBc/Hz+10*$\log_{10}(f_M/10$ GHZ) at 10 KHz offset frequency.

Example 22. The microwave-frequency source of any one of Examples 1 through 19, the output electrical signal of the microwave-frequency source exhibiting, over the entire tuning range for the frequency $f_M$, phase noise less than −140 dBc/Hz+10*$\log_{10}(f_M/10$ GHZ) at 10 KHz offset frequency.

This disclosure is illustrative and not limiting. Further modifications will be apparent to one skilled in the art in light of this disclosure and are intended to fall within the scope of the present disclosure or appended claims. It is intended that equivalents of the disclosed example embodiments and methods, or modifications thereof, shall fall within the scope of the present disclosure or appended claims.

In the foregoing Detailed Description, various features may be grouped together in several example embodiments for the purpose of streamlining the disclosure. This method of disclosure is not to be interpreted as reflecting an intention that any claimed embodiment requires more features than are expressly recited in the corresponding claim. Rather, as the appended claims reflect, inventive subject matter may lie in less than all features of a single disclosed example embodiment. Therefore, the present disclosure shall be construed as implicitly disclosing any embodiment having any suitable subset of one or more features-which features are shown, described, or claimed in the present application-including those subsets that may not be explicitly disclosed herein. A "suitable" subset of features includes only features that are neither incompatible nor mutually exclusive with respect to any other feature of that subset. Accordingly, the appended claims are hereby incorporated in their entirety into the Detailed Description, with each claim standing on its own as a separate disclosed embodiment. In addition, each of the appended dependent claims shall be interpreted, only for purposes of disclosure by said incorporation of the claims into the Detailed Description, as if written in multiple dependent form and dependent upon all preceding claims with which it is not inconsistent. It should be further noted that the cumulative scope of the appended claims can, but does not necessarily, encompass the whole of the subject matter disclosed in the present application.

The following interpretations shall apply for purposes of the present disclosure and appended claims. The words "comprising," "including," "having," and variants thereof, wherever they appear, shall be construed as open ended terminology, with the same meaning as if a phrase such as "at least" were appended after each instance thereof, unless explicitly stated otherwise. The article "a" shall be interpreted as "one or more" unless "only one," "a single," or other similar limitation is stated explicitly or is implicit in the particular context; similarly, the article "the" shall be interpreted as "one or more of the" unless "only one of the," "a single one of the," or other similar limitation is stated explicitly or is implicit in the particular context. The conjunction "or" is to be construed inclusively unless: (i) it is explicitly stated otherwise, e.g., by use of "either . . . or," "only one of," or similar language; or (ii) two or more of the listed alternatives are understood or disclosed (implicitly or explicitly) to be incompatible or mutually exclusive within the particular context. In that latter case, "or" would be understood to encompass only those combinations involving non-mutually-exclusive alternatives. In one example, each of "a dog or a cat," "one or more of a dog or a cat," and "one or more dogs or cats" would be interpreted as one or more dogs without any cats, or one or more cats without any dogs, or one or more of each.

For purposes of the present disclosure or appended claims, when a numerical quantity is recited (with or without terms such as "about," "about equal to," "substantially equal to," "greater than about," "less than about," and so forth), standard conventions pertaining to measurement precision, rounding error, and significant digits shall apply, unless a differing interpretation is explicitly set forth, or if a differing interpretation is implicit or inherent (e.g., some small integer quantities). For null quantities described by phrases such as "equal to zero," "absent," "eliminated," "negligible," "prevented," and so forth (with or without terms such as "about," "substantially," and so forth), each such phrase shall denote the case wherein the quantity in question has been reduced or diminished to such an extent that, for practical purposes in the context of the intended operation or use of the disclosed or claimed apparatus or method, the overall behavior or performance of the apparatus or method does not differ from that which would have occurred had the null quantity in fact been completely removed, exactly equal to zero, or otherwise exactly nulled. Terms such as "parallel," "perpendicular," "orthogonal," "flush," "aligned," and so forth shall be similarly interpreted (with or without terms such as "about," "substantially," and so forth).

For purposes of the present disclosure and appended claims, any labelling of elements, steps, limitations, or other portions of an embodiment, example, or claim (e.g., first, second, third, etc., (a), (b), (c), etc., or (i), (ii), (iii), etc.) is only for purposes of clarity, and shall not be construed as implying any sort of ordering or precedence of the portions so labelled. If any such ordering or precedence is intended, it will be explicitly recited in the embodiment, example, or claim or, in some instances, it will be implicit or inherent based on the specific content of the embodiment, example, or claim. In the appended claims, if the provisions of 35 USC § 112 (f) are desired to be invoked in an apparatus claim, then the word "means" will appear in that apparatus claim. If those provisions are desired to be invoked in a method claim, the words "a step for" will appear in that method claim. Conversely, if the words "means" or "a step for" do not appear in a claim, then the provisions of 35 USC § 112 (f) are not intended to be invoked for that claim.

If any one or more disclosures are incorporated herein by reference and such incorporated disclosures conflict in part or whole with, or differ in scope from, the present disclosure, then to the extent of conflict, broader disclosure, or broader definition of terms, the present disclosure controls. If such incorporated disclosures conflict in part or whole with one another, then to the extent of conflict, the later-dated disclosure controls.

The Abstract is provided as required as an aid to those searching for specific subject matter within the patent literature. However, the Abstract is not intended to imply that any elements, features, or limitations recited therein are necessarily encompassed by any particular claim. The scope of subject matter encompassed by each claim shall be determined by the recitation of only that claim.

What is claimed is:

1. A microwave-frequency source comprising:
(a) a tunable voltage-controlled electrical oscillator (VCO) arranged so as to generate a VCO output electrical signal at a frequency $f_M$, a first portion of which forms an output electrical signal of the microwave-frequency source, the VCO being tunable over a tuning range for the frequency $f_M$ that spans at least ±5% of a nominal microwave frequency, the nominal microwave frequency being between 1 GHz and 100 GHz;
(b) a dual optical-frequency reference source arranged so as to generate (i) a first optical reference signal at a first optical reference frequency $v_1$ and (ii) a second optical reference signal at a second optical reference frequency $v_2$ that is greater than $v_1$;
(c) an electrical reference oscillator arranged so as to generate a reference oscillator electrical signal at a reference oscillator frequency $\delta f_{REF}$; and
(d) an electro-optic frequency divider (eOFD) structured and connected so as to (i) receive the first and second optical reference signals, a second portion of the VCO output electrical signal, and the reference oscillator electrical signal, (ii) generate from the first and second optical reference signals and the second portion of the VCO output electrical signal an eOFD electrical signal at a frequency $\delta f = |v_2 - v_1 - n \cdot f_M|$ where n is an integer, (iii) generating a loop-filtered electrical error signal dependent on relative phase of the reference oscillator and eOFD electrical signals, and (iv) applying the loop-filtered electrical error signal to the VCO to couple the VCO and the eOFD in a negative feedback arrangement so as to function as a phase-locked loop to stabilize the frequency $f_M$.

2. The microwave-frequency source of claim 1, the tuning range for the frequency $f_M$ spanning at least ±10% of a nominal microwave frequency.

3. The microwave-frequency source of claim 1, the tuning range for the frequency $f_M$ spanning at least ±25% of a nominal microwave frequency.

4. The microwave-frequency source of claim 1, the tuning range for the frequency $f_M$ spanning at least ±33% of a nominal microwave frequency.

5. The microwave-frequency source of claim 1, the tuning range for the frequency $f_M$ spanning at least from 8 GHz to 40 GHz.

6. The microwave-frequency source of claim 1, the VCO including a yttrium iron garnet (YIG) VCO.

7. The microwave-frequency source of claim 1, the VCO including an integrated-circuit (IC) VCO.

8. The microwave-frequency source of claim 1, the VCO including a fundamental VCO and a frequency multiplier coupled to the fundamental VCO, the VCO being arranged so that the fundamental VCO provides the VCO output electrical signal over a lower-frequency portion of the tuning range for the frequency $f_M$ and the frequency multiplier provides the VCO output electrical signal over a higher-frequency portion of the tuning range for the frequency $f_M$.

9. The microwave-frequency source of claim 8, the frequency multiplier including a frequency doubler.

10. The microwave-frequency source of claim 8, the fundamental VCO being tunable over a tuning range from 8 GHz to 20 GHz.

11. The microwave-frequency source of claim 1, the dual optical-frequency reference source including first and second frequency-stabilized reference laser sources operating at respective laser frequencies $v_{L1}$ and $v_{L2}$.

12. The microwave-frequency source of claim 11, the dual optical-frequency reference source including an optical reference cavity, the first and second reference laser sources each being frequency-locked to a corresponding distinct resonant optical mode of the optical reference cavity.

13. The microwave-frequency source of claim 12 wherein the first and second optical reference signals include laser outputs of the first and second reference laser sources so that $v_1 = v_{L1}$ and $v_2 = v_{L2}$.

14. The microwave-frequency source of claim 12 wherein (i) the optical reference cavity is characterized by a Brillouin frequency $v_B$, (ii) the first and second reference laser sources act as pump lasers to produce corresponding first and second stimulated Brillouin laser (SBL) outputs from the optical reference cavity at respective SBL frequencies $v_{1L}-v_B$ and $v_{2L}-v_B$, and (iii) the first and second optical reference signals include the first and second SBL outputs so that $v_1 = v_{1L}-v_B$ and $v_2 = v_{2L}-v_B$.

15. The microwave-frequency source of claim 12, the optical reference cavity being arranged as a whispering-gallery-mode resonator, a ring waveguide resonator on a substrate, a disk resonator, a spiral waveguide resonator on a substrate, or a fiber-ring resonator.

16. The microwave-frequency source of claim 12, the first and second reference laser sources being frequency locked to the optical reference cavity by a Pound-Drever-Hall locking mechanism, a Hansch-Couillaud locking mechanism, or self-injection locking.

17. The microwave-frequency source of claim 11, the eOFD being structured and arranged so as to (i) generate from the first or second optical reference signals corresponding first or second optical frequency combs, or both, with respective frequency-comb components at frequencies $v_1 \pm n_1 \cdot f_M$ and $v_2 \pm n_2 \cdot f_M$ where $n_1$ and $n_2$ are integers, and (ii) the generate the eOFD electrical signal at the frequency $\delta f$ by receiving at a photodetector a frequency-comb component of the first frequency comb and the second optical reference signal, a frequency comb component of the second frequency comb and the first optical reference signal, or frequency-comb components of both the first and second optical frequency combs, the eOFD electrical signal comprising a beat note produced by the photodetector from the received optical reference signals or frequency-comb components.

18. The microwave-frequency source of claim 17, the first or second optical frequency combs being generated by one or more optical modulators driven by the second portion of the VCO output electrical signal at the frequency f.

19. The microwave-frequency source of claim 1, the reference oscillator frequency $\delta f_{REF}$ being between 1 MHz and 40 GHz.

20. The microwave-frequency source of claim 1, the output electrical signal of the microwave-frequency source exhibiting, over the entire tuning range for the frequency $f_M$, phase noise less than $-120$ dBc/Hz$+10*\log_{10}(f_M/10$ GHZ$)$ at 10 KHz offset frequency.

21. The microwave-frequency source of claim 1, the output electrical signal of the microwave-frequency source exhibiting, over the entire tuning range for the frequency $f_M$, phase noise less than $-130$ dBc/Hz$+10*\log_{10}(f_M/10$ GHZ$)$ at 10 kHz offset frequency.

22. The microwave-frequency source of claim 1, the output electrical signal of the microwave-frequency source exhibiting, over the entire tuning range for the frequency $f_M$, phase noise less than $-140$ dBc/Hz$+10*\log_{10}(f_M/10$ GHZ$)$ at 10 KHz offset frequency.

* * * * *